United States Patent [19]

Niitsu

[11] Patent Number: 5,137,839
[45] Date of Patent: Aug. 11, 1992

[54] METHOD OF MANUFACTURING A BIPOLAR TRANSISTOR HAVING POLYSILICON LAYER WHICH SERVES AS AN EMITTER ELECTRODE AND PASSIVATING DANGLING BONDS

[75] Inventor: Youchiro Niitsu, Yokohama, Japan

[73] Assignee: Kabushiki Kaisha Toshiba, Kawasaki, Japan

[21] Appl. No.: 705,497

[22] Filed: May 24, 1991

[30] Foreign Application Priority Data

May 28, 1990 [JP] Japan ................... 2-137332

[51] Int. Cl.⁵ .................... H01L 21/265; H01L 29/73
[52] U.S. Cl. ........................ 437/31; 437/24; 437/186; 437/980; 148/DIG. 10
[58] Field of Search ............ 437/24, 31, 980, 186

[56] References Cited

U.S. PATENT DOCUMENTS

| | | | |
|---|---|---|---|
| 4,613,382 | 9/1988 | Katayama et al. | 437/18 |
| 4,978,630 | 12/1990 | Kim | 437/312 |
| 4,992,840 | 2/1991 | Haddad et al. | 357/233 |

FOREIGN PATENT DOCUMENTS

| | | | |
|---|---|---|---|
| 0273075 | 3/1983 | European Pat. Off. | 437/24 |
| 0054217 | 3/1984 | Japan | 437/24 |
| 0107576 | 6/1984 | Japan | 437/24 |
| 0124520 | 5/1988 | Japan | 437/24 |

OTHER PUBLICATIONS

IEEE Transactions on Electron Devices, vol. ED-33. No. 11, Nov. 1986, pp. 1754 to 1768, Gary L. Patton et al.

Primary Examiner—Olik Chaudhuri
Assistant Examiner—Long Pham
Attorney, Agent, or Firm—Finnegan, Henderson, Farabow, Garrett and Dunner

[57] ABSTRACT

In a bipolar transistor, a polysilicon layer formed on an emitter diffusion layer is used as an emitter electrode. After the polysilicon layer is formed, an atom is introduced into the polysilicon layer. A thermal treatment is then performed, and the atom is combined with a dangling bond of a silicon atom existing on a crystal grain interface of the polysilicon layer, thereby passivating the dangling bond of the silicon atom.

6 Claims, 3 Drawing Sheets

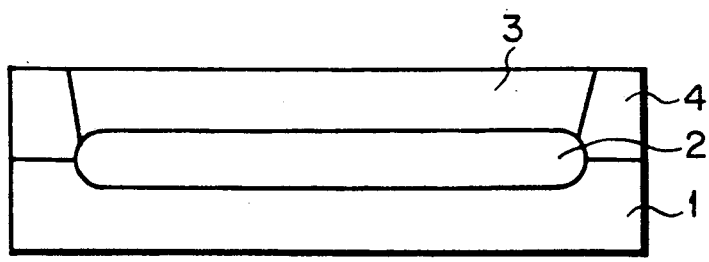
F I G. 1
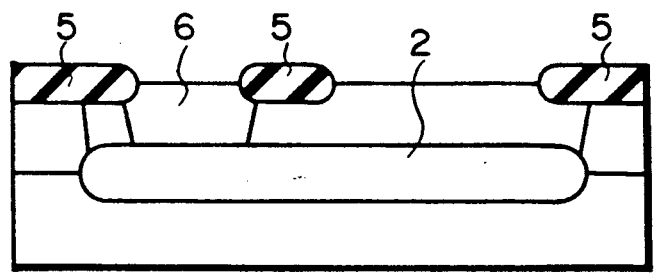
F I G. 2
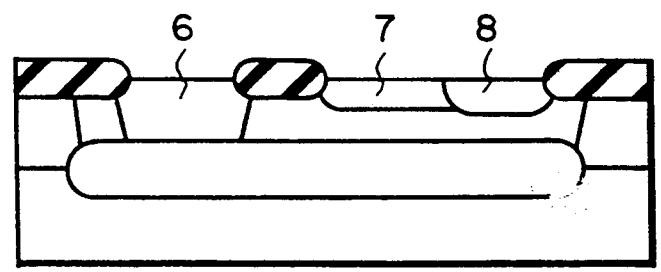
F I G. 3
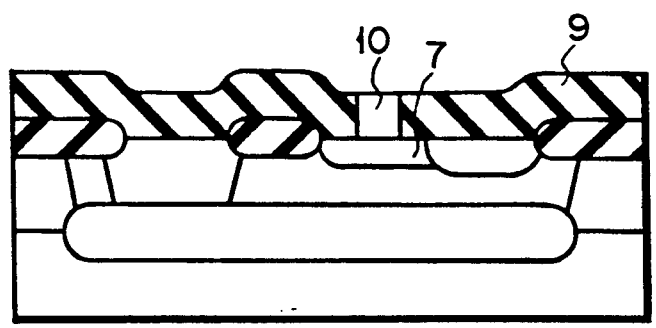
F I G. 4

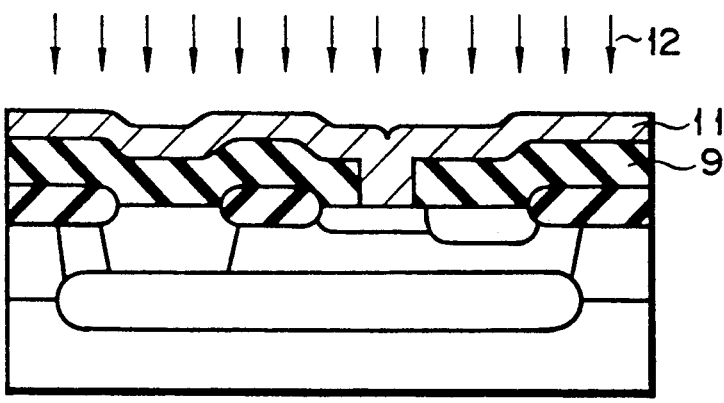
F I G. 5
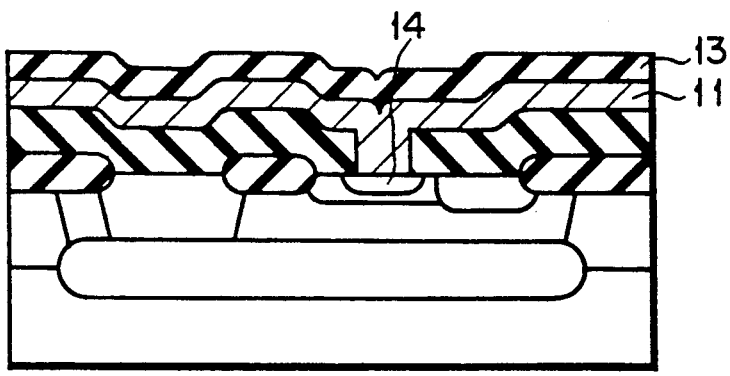
F I G. 6
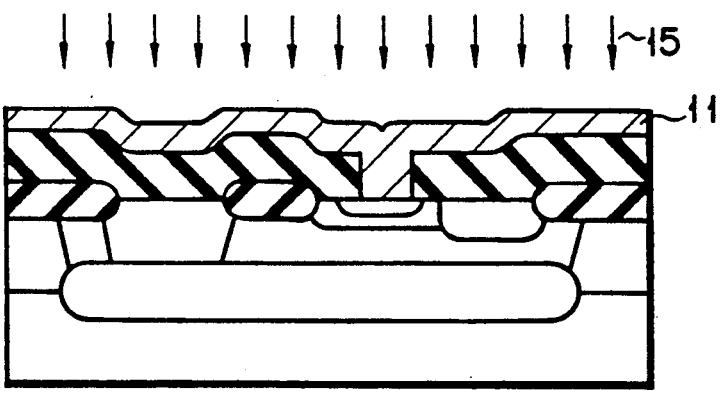
F I G. 7

METHOD OF MANUFACTURING A BIPOLAR TRANSISTOR HAVING POLYSILICON LAYER WHICH SERVES AS AN EMITTER ELECTRODE AND PASSIVATING DANGLING BONDS

BACKGROUND OF THE INVENTION

1. Field of the Invention

The present invention relates to a method of manufacturing a semiconductor device and, more particularly, to a method of manufacturing a bipolar transistor whose polysilicon layer serves as an emitter electrode and a semiconductor integrated circuit device including this type of bipolar transistor.

2. Description of the Related Art

Recently, it is the mainstream in a bipolar transistor to use a polysilicon layer formed on an emitter diffusion layer as an emitter leading electrode. This bipolar transistor is disclosed in, for example, IEEE TRANSACTIONS ON ELECTRON DEVICES. VOL. ED-33, NO. 11, NOVEMBER 1986, pp.1754 to 1768. "Physics, Technology, and Modeling of Polysilicon Emitter Contacts for VLSI Bipolar Transistors" GARY L. PATTON et al. The bipolar transistor has the structural advantage of, even if a junction of the emitter diffusion layer is shallow, increasing an effective emitter length (which corresponds to a distance between the emitter junction and the contact of metal wiring and polysilicon layer) by the polysilicon layer and thus preventing a base current from increasing.

In the bipolar transistor, however, recombination of minority carriers on the crystal grain interface of the polysilicon layer cannot be disregarded. The base current injected into the emitter diffusion layer is thus varied by the grain diameter of polysilicon, and a variation, which cannot be neglected, occurs in element characteristics such as a current amplification factor. Since the grain diameter of the polysilicon is largely influenced by a deposition temperature of the polysilicon layer, and also by a thermal treatment step included in the manufacturing method of the bipolar transistor, the uniformity of the polysilicon cannot be easily achieved.

The interface trap charge, which is the center of the recombination of the minority carriers on the crystal grain interface of the polysilicon on the emitter diffusion layer, originates from a dangling bond of a silicon atom existing on the grain interface.

SUMMARY OF THE INVENTION

It is accordingly an object of the present invention to provide a method of manufacturing a semiconductor device which can prevent a variation in element characteristics of a bipolar transistor having a polysilicon layer serving as an emitter electrode.

To attain the above object, there is provided a method of manufacturing a semiconductor device, comprising the steps of forming a bipolar transistor having a polysilicon layer formed on an emitter diffusion layer and serving as an emitter electrode; introducing an atom into the polysilicon layer; and performing a thermal treatment to combine the atom with a dangling bond of a silicon atom existing on a crystal grain interface of the polysilicon layer, thereby passivating the dangling bond of the silicon atom.

According to the manufacturing method described above, since an atom combined with the dangling bond of the silicon atom is introduced into the polysilicon layer, the dangling bond is passivated by the introduced atom. The density of interface trap charge on the crystal grain interface of the polysilicon can thus be lowered. As a result, minority carriers on the crystal grain interface can be prevented from being recombined with one another and a variation in element characteristics such as a current amplification factor of the bipolar transistor can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1 to 8 are cross-sectional views showing steps of manufacturing an NPN bipolar transistor in sequence, to explain a method of manufacturing a semiconductor device according to the embodiment of the present invention.

DETAILED DESCRIPTION OF THE PREFERRED EMBODIMENTS

Figure 8:
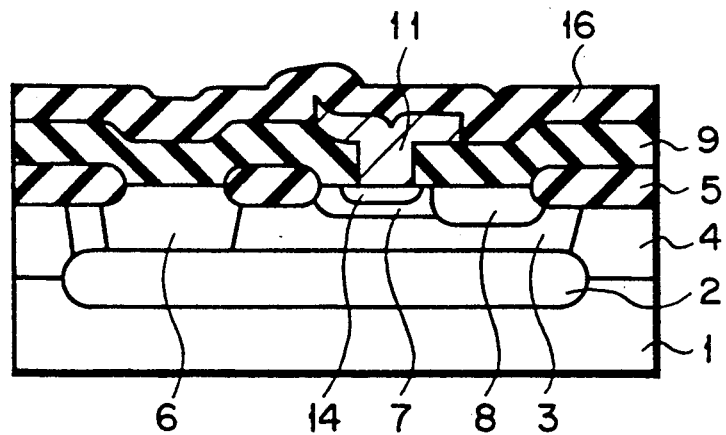

A method of manufacturing a semiconductor device according to an embodiment of the present invention will be described, giving an NPN bipolar transistor by way of example. FIGS. 1 to 8 illustrate showing the main steps of manufacturing the NPN bipolar transistor in sequence.

An N-type impurity is doped to the major surface of a P-type semiconductor substrate (silicon substrate) to form an N-type epitaxial layer 3 thereon. When the epitaxial layer 3 is formed, the N-type impurity is diffused into the substrate 1 and epitaxial layer 3 to form an N+-type buried layer 2. A P-type impurity is selectively ion-implanted into the epitaxial layer 3 to form a thick P-type impurity diffusion layer (isolation region) 4 for isolating an adjacent transistor (not shown) and a collector region which are adjacent to each other. The structure as shown in FIG. 1 is thus obtained.

As illustrated in FIG. 2, an element-isolating field insulation film 5 is formed on the resultant structure (epitaxial layer 3 and P-type impurity diffusion layer 4) by the selective oxidation process so as to surround an element-forming prospective region. An N+-type impurity diffusion layer 6, which is so thick as to reach the buried layer 2, is formed in part of the element-forming prospective region (N-type epitaxial layer 3) by ion implantation.

As illustrated in FIG. 3, a P-type impurity diffusion layer 7 serving as an inner base and a P+-type impurity diffusion layer 8 serving as an outer base are formed in part of the N-type epitaxial layer 3 so as to be isolated from the N+-type impurity diffusion layer 6.

As shown in FIG. 4, an insulation film 9 is formed on the resultant structure. The insulation film 9 is patterned to an opening 10 which is used to form an emitter diffusion layer in the P-type impurity diffusion layer 7.

As shown in FIG. 5, a polysilicon layer 11 is deposited on the insulation film 9. An N-type impurity 12 such as arsenic (As) and phosphorus (P) is ion-implanted into the polysilicon layer 11. The polysilicon layer 11 serves as a diffusion source for forming an emitter region.

As illustrated in FIG. 6, an insulation film 13 is formed on the polysilicon layer 11. The resultant structure is thermally treated and thus the N-type impurity 12 of the polysilicon layer 11 is thermally diffused into the P-type impurity diffusion layer 7, thereby forming an N-type emitter diffusion layer 14.

After the insulation film 13 is removed, as shown in FIG. 7, an atom 15 combined with a dangling bond of silicon, for example, one or some of fluorine (F), fluoride, hydrogen (H) and carbon (C) is ion-implanted into the N-type polysilicon layer 11.

As illustrated in FIG. 8, the polysilicon layer 11 is patterned to form an emitter leading electrode. The resultant structure is covered with an interlayer insulation film 16 and then undergoes a thermal treatment. When fluorine is ion-implanted, the thermal treatment is carried out at a temperature of about 850° C. for thirty minutes. When hydrogen is ion-implanted, it is carried out at a temperature of about 600° C. for thirty minutes. This thermal treatment allows the ion-implanted atom of the emitter leading electrode to uniformly diffuse into the polysilicon layer 11 to such a depth that the atom reaches the surface of the emitter diffusion layer 14.

Figure 9:
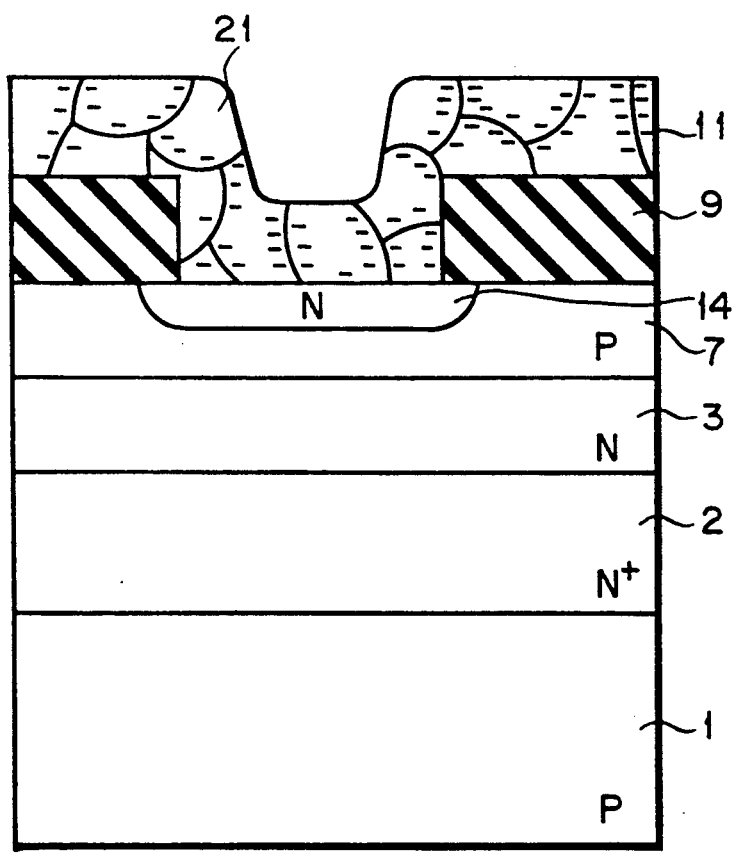
FIG. 9 is an enlarged cross-sectional view showing part of the NPN bipolar transistor shown in FIG. 7, to explain the density of interface trap charge on the crystal grain interface of a polysilicon layer formed on an emitter diffusion layer.

According to the manufactured method described above, since an atom is introduced into the polysilicon layer 11 which has not been patterned (or which has been patterned) to form the emitter leading electrode and thereafter the atom is combined with a silicon atom having a dangling bond existing on the crystal grain interface of polysilicon by the thermal treatment, the dangling bond of the silicon atom can be passivated. It is therefore possible to decrease the density of interface trap charge (−) on the crystal grain interface 21 of the polysilicon layer 11 formed on the emitter diffusion layer, as shown in FIG. 9. Consequently, recombination of minority carriers on the grain boundary can be prevented and a variation in element characteristics of the bipolar transistor can be prevented.

The inventor of the present invention has measured both a variation in current amplification factor obtained when an NPN bipolar transistor is manufactured by the conventional method and a variation in current amplification factor obtained when it is manufactured by the method of the present invention. As a result of this measurement, the former variation ranges from 50 to 200, and the latter variation is decreased to a range from 80 to 150.

The feature of the present invention resides in that an atom is introduced into a polysilicon layer for forming an emitter leading electrode, then the atom is combined with a silicon atom having a dangling bond existing on the crystal grain interface of polysilicon by the thermal treatment, and the dangling bond of the silicon atom can thus be passivated. The atom can be introduced either after the polysilicon layer is formed or after the polysilicon layer is patterned. The introduction of the atom can be performed using a vapor phase diffusion method other than ion-implantation. The bipolar transistor is not limited to the above-described one-layered polysilicon structure but can be applied to a two-layered polysilicon structure using a self-align opening and also a hetero-bipolar transistor (HBT) in which SiC or $\mu$C-Si (microcrystal silicon) is used as an emitter electrode.

In the foregoing embodiment, a discrete device has been described. It is of course that the present invention can be applied to a bipolar semiconductor integrated circuit. The present invention can also be applied to a hybrid semiconductor integrated circuit device of a bipolar transistor and a MOS (insulation gate type) transistor or a hybrid semiconductor integrated circuit device of a bipolar transistor and a charge coupled device (CCD), an electrically programmable ROM (EPROM) or the like.

As described above, according to the method of manufacturing a semiconductor device of the present invention, since the density of interface trap charge on the crystal grain interface of the polysilicon layer formed on the emitter diffusion layer of the bipolar transistor, in which the polysilicon layer serves as an emitter electrode, can be reduced, minority carriers on the crystal grain interface can be prevented from being recombined. Consequently, a variation in element characteristics can be prevented, a current amplification factor can be increased, and a degradation of junction between the emitter and base can be prevented.

What is claimed is:

1. A method of manufacturing a semiconductor device, comprising the steps of:
   forming a bipolar transistor having a polysilicon layer formed on an emitter diffusion layer and serving as an emitter electrode;
   introducing at least one of a fluorine atom and a hydrogen atom into the polysilicon layer;
   covering the polysilicon layer with an interlayer insulation film; and
   performing a thermal treatment (i) to combine a silicon atom having a dangling bond which exists on a crystal grain interface of the polysilicon layer with said at least one of the fluorine atom and the hydrogen atom, thereby passivating the dangling bond of the silicon atom, and (ii) to lower an interface trap charge density on the crystal grain interface of the polysilicon layer, thereby preventing minority carriers on the crystal grain interface from being recombined with one another.

2. The method according to claim 1, wherein said atom is introduced into said polysilicon layer using an ion-implantation method.

3. The method according to claim 1, wherein said atom is introduced into said polysilicon layer using a vapor phase diffusion method.

4. The method according to claim 1, wherein said step of forming the bipolar transistor comprises the steps of:
   introducing an impurity of a second conductivity type into a major surface of a semiconductor substrate of a first conductivity type;
   forming an epitaxial layer of the second conductivity type on said semiconductor substrate and diffusing the impurity of the second conductivity type into said semiconductor substrate and said epitaxial layer to form a buried layer;

selectively forming a field insulation film on said epitaxial layer;

forming a first impurity diffusion layer of the second conductivity type in said epitaxial layer to such a depth as to reach said buried layer;

forming a second impurity diffusion layer of the first conductivity type serving as an inner base in said epitaxial layer away from said first impurity diffusion layer;

forming a third impurity diffusion layer of the first conductivity type serving as an outer base in said epitaxial layer away from said first impurity diffusion layer and in contact with said second impurity diffusion layer;

forming an insulation film on a resultant structure;

forming an opening in said insulation film on part of said second impurity diffusion layer;

forming a polysilicon layer on said insulation film and in said opening;

introducing an impurity of the second conductivity type into said polysilicon layer; and forming an emitter diffusion layer of the second conductivity type in said second impurity diffusion layer while using said polysilicon layer as a diffusion source.

5. The method according to claim 4, further comprising a step of forming an isolation region of the first conductivity type in said epitaxial layer to such a depth as to reach the major surface of said semiconductor substrate after said step of forming the epitaxial layer of the second conductivity type and forming the buried layer.

6. The method according to claim 1, wherein said step of introducing the impurity of the second conductivity type into said polysilicon layer comprises a step of ion-implanting an impurity of the second conductivity type into said polysilicon layer, a step of forming an insulation film on said polysilicon layer, and a step of diffusing the ion-implanted impurity by a thermal treatment.

* * * * *